United States Patent
Govind

(10) Patent No.: US 6,982,610 B2
(45) Date of Patent: Jan. 3, 2006

(54) TERMINATION IMPEDANCE TUNING CIRCUIT

(75) Inventor: Aruna Govind, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/783,045

(22) Filed: Feb. 19, 2004

(65) Prior Publication Data

US 2005/0184824 A1 Aug. 25, 2005

(51) Int. Cl.
*H03H 7/38* (2006.01)

(52) U.S. Cl. ............... 333/32; 333/17.3; 333/263; 333/81 R; 333/22 R; 326/30

(58) Field of Classification Search ............ 333/32–33, 333/17.3, 263, 81 R, 124–131, 101, 262; 326/30; 327/308, 362

See application file for complete search history.

(56) References Cited

U.S. PATENT DOCUMENTS

| | | | |
|---|---|---|---|
| 5,396,028 A | 3/1995 | Tomassetti | |
| 5,422,608 A | 6/1995 | Levesque | |
| 5,510,727 A | 4/1996 | Culmer et al. | |
| 6,628,223 B2 * | 9/2003 | Nagano | 341/155 |
| 6,862,714 B2 * | 3/2005 | Jin et al. | 716/1 |

\* cited by examiner

*Primary Examiner*—Benny Lee
*Assistant Examiner*—Kimberly E Glenn
(74) *Attorney, Agent, or Firm*—J. Dennis Moore; W. James Brady, III; Frederick J. Telecky, Jr.

(57) ABSTRACT

An impedance adjustment system comprising current source, a first series and a second series connected string of predetermined number of resistors, a first and second switch network, a first, second and third logic circuit and a comparator. By applying the principles of the present invention, embodiments can be made in which variations in a Silicide block of resistors used to terminate a signal line are "tuned out" to get a more precise termination impedance. Embodiments may be made that hold the termination impedance substantially constant over time by continually adjusting in response to variations in process, temperature and supply voltage. IDDQ requirements can be met by latching, by double buffering, the outputs of comparators providing an encoded resistor network setting for the termination impedance, and then powering down the circuit. Embodiments of the present invention avoid the use of trims and fuses, thus reducing fabrication cost. Finally, embodiments of the present invention may be made that do not require a clock.

2 Claims, 4 Drawing Sheets

TERMINATION IMPEDANCE TUNING CIRCUIT

TECHNICAL FIELD OF THE INVENTION

This invention relates to terminating signal lines, and more particularly relates to matching the impedance of a circuit element to the signal line with which it interfaces.

BACKGROUND OF THE INVENTION

It is well known that to optimize signal transmission to and/or from a circuit element and a signal line to which it is connected, the impedance of the circuit element, i.e., its termination impedance, should match as closely as possible the impedance of the signal line. This can be difficult, since integrated circuit technology has inherent variability in process parameters that affect the impedance of circuit elements. Thus, the same circuit element may have different impedances from IC to IC, simply because of this variation in process parameters.

Numerous schemes have been utilized to overcome this problem, with varying degrees of success. However, such schemes can be limited in their accuracy, and have a limited range over which they may be tuned, if, indeed, they can be tuned at all. With modern trends in electronics driving not only circuit element size ever smaller, but also signal levels, it is becoming even more critical to be able to match termination impedances with signal lines with high accuracy, and over a wide range. In fact, it would be desirable to not only provide termination impedances that are adjustable to compensate for process parameter variations, but also to provide continuous calibration of termination impedance to compensate for variations arising from environmental factors such as temperature.

SUMMARY OF THE INVENTION

The present invention provides an impedance adjustment system. A current source is adapted to provide a predetermined stabilized current corresponding to a current through a first resistor having across it a predetermined stabilized voltage, for example a bandgap voltage. A first series connected string of a first predetermined number of resistors is coupled between the current source and ground, being coupled to the current source at a sense node. A first switch network is adapted to select ones of the first predetermined number of resistors for inclusion in the first series connected string. A first logic circuit is adapted to control the first switch network to incrementally change the total resistance of the first series connected string. A comparator is provided, having a first input coupled to the predetermined stabilized voltage, having a second input coupled to the sense node, and having an output representing the direction of difference in voltage between the first input and the second input of the comparator. A second logic circuit is responsive to the output of the comparator, and is adapted to hold a state of the first switch network to maintain a coarse resistance value of the first series connected string at a value corresponding to a value before which the comparator changes state when the first logic circuit incrementally changes the resistance of the first series connected string, while disconnecting the first series connected string from ground. A second series connected string of a second predetermined number of resistors has a first end coupled to ground, the second logic circuit being adapted to couple a second end of the second series connected string to the end of the portion of the first series connected string that provides the coarse resistance value. A second switch network is adapted to select ones of the second predetermined number of resistors for inclusion in the second series connected string. A third logic circuit is adapted to control the second switch network to incrementally change the total resistance of the second series connected string, wherein the second logic circuit is responsive to the output of the comparator and adapted to hold a state of the second switch network to maintain a fine resistance value of the first series connected string at a value corresponding to a value at which the comparator changes state when the third logic circuit incrementally changes the resistance of the first series connected string.

By applying the principles of the present invention, embodiments can be made in which variations in a Silicide block of resistors used to terminate a signal line are "tuned out" to get a more precise termination impedance. Embodiments may be made that hold the termination impedance substantially constant over time by continually adjusting in response to variations in process, temperature and supply voltage. IDDQ requirements can be met by latching, by double buffering, the outputs of comparators providing an encoded resistor network setting for the termination impedance, and then powering down the circuit. Embodiments of the present invention avoid the use of trims and fuses, thus reducing fabrication cost. Finally, embodiments of the present invention may be made that do not require a clock.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 1:
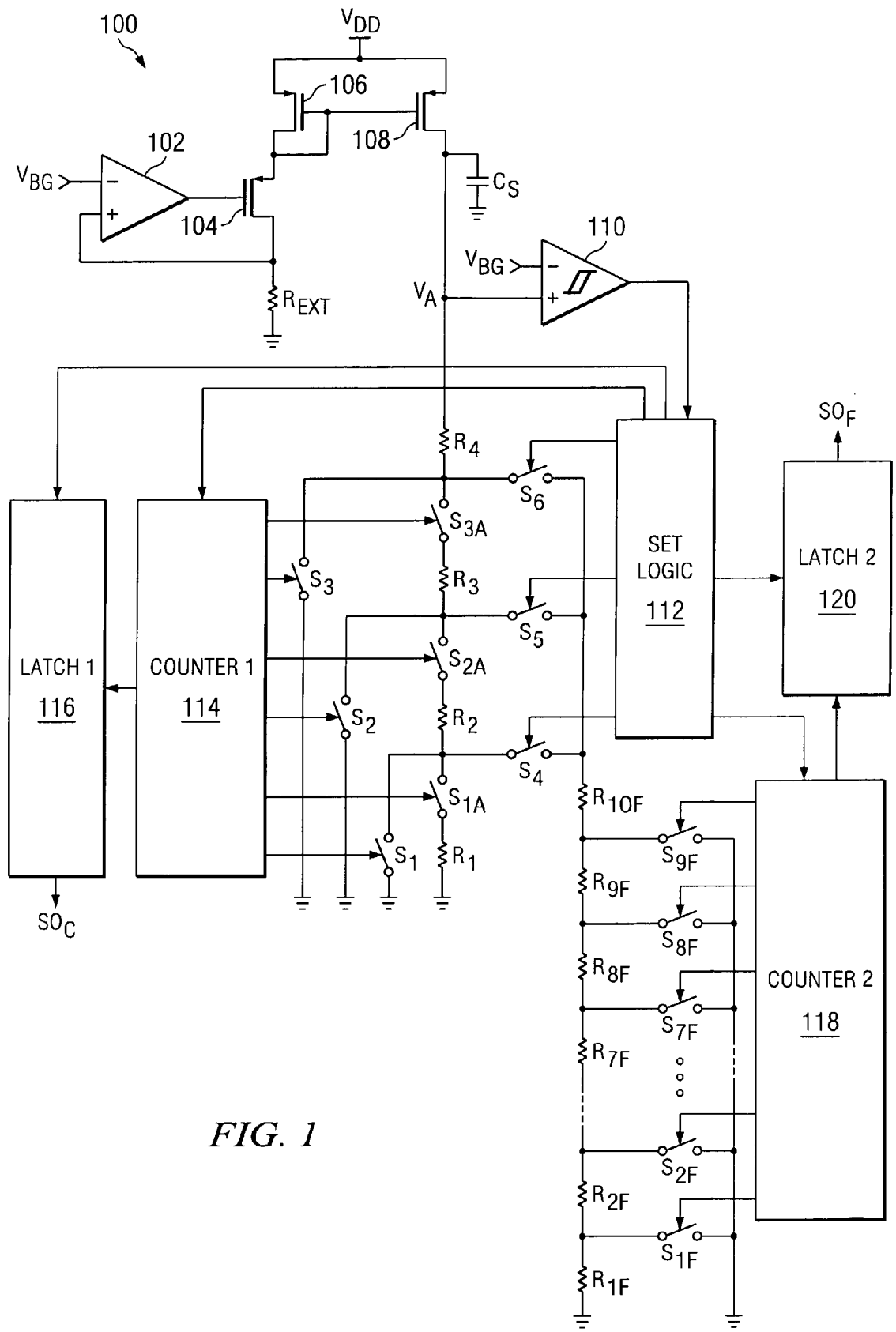
FIG. 1 is a circuit diagram of a first preferred embodiment of the present invention.

FIG. 1 is a circuit diagram of a calibration system of a first preferred embodiment 100 of the present invention. An opamp 102 is provided, having a bandgap voltage $V_{BG}$ provided to its non-inverting input. Its output is connected to the gate of an NMOS transistor 104. The drain of transistor 104 is connected to one port of a precision external resistor $R_{EXT}$, the other port of which is connected to ground, and to the inverting input of opamp 102. The drain of transistor 104 is connected to an input side of a current mirror comprised of NMOS transistors 106 and 108. The current mirror is connected to the power supply at $V_{DD}$. This provides a reference current for programmable resistor bridges, discussed below, that is stabilized with respect to temperature, process and supply voltage.

The output side of the current mirror is connected to a switched series bridge of resistors $R_1$, $R_2$, $R_3$ and $R_4$, for coarse tuning, with one port of resistor $R_1$ being connected to ground, and having switch $S_{1A}$ connected between the other port of resistor $R_1$ and one port of resistor $R_2$, and having switch $S_{2A}$ connected between the other port of resistor $R_2$ and one port of resistor $R_3$, and having switch $S_{3A}$ connected between the other port of resistor $R_3$ and one port of resistor $R_4$, with the other port of resistor $R_4$ being connected to the output side of the current mirror. The output side of the current mirror is also connected to the non-inverting input of a second comparator 110, with comparator 110 having one-sided hysteresis of 50 mV to provide stability in switching. A bandgap voltage $V_{BG}$ is connected to the inverting input of comparator 110. The output of comparator 110 is connected to a set logic block 112. A smoothing capacitor $C_S$ is connected between the output side of the current mirror and ground, to smooth the signal at the non-inverting input of comparator 110 to transition in approximately one μs, and thus avoid glitches. It will be appreciated that selection of the capacitor value is a matter of design choice. A switch $S_1$ is connected between the common connection node of switch $S_{1A}$ and resistor $R_2$ and ground, a switch $S_2$ is connected between the common connection node of switch $S_{2A}$ and resistor $R_3$ and ground, and switch $S_3$ is connected between the common connection node of switch $S_{3A}$ and resistor $R_4$ and ground. Switches $S_1$, $S_2$, $S_3$, $S_{1A}$, $S_{2A}$, and $S_{3A}$ are all controlled by the state (i.e., count) of a first counter/decoder 114. A first latch 116 with double buffering of its stored state is provided to store a state of counter/decoder 114, and to provide the stored state as an output $SO_C$.

A switch $S_4$ is connected between the common connection node of switch $S_{1A}$ and resistor $R_2$ and a first end of a series resistor bridge of resistors $R_{1F}$, $R_2F$, $R_{3F}$ . . . and $R_{10F}$, for fine tuning, with the second end of the series resistor bridge being connected to ground, with one port of resistor $R_1F$ being connected to ground, and the other port to one port of resistor $R_{2F}$, with the other port of resistor $R_{2F}$ being connected to one port of resistor $R_{3F}$, and so forth. A switch $S_5$ is connected between the common connection node of switch $S_{2A}$ and resistor $R_3$ and the first end of the series resistor bridge, and a switch $S_6$ is connected between the common connection node of switch $S_{3A}$ and resistor $R_4$ and the first end of the series resistor bridge. Switches $S_4$, $S_5$, and $S_6$ are all controlled by the set logic block 112.

A switch $S_{1F}$ is connected between the common connection node of resistor $R_{1F}$ and resistor $R_{2F}$ and ground, a switch $S_{2F}$ is connected between the common connection node of resistor $R_{2F}$ and resistor $R_{3F}$ and ground, and so forth, with a switch $S_{9F}$ being connected between the common connection node of resistor $R_{9F}$ and resistor $R_{10F}$ and ground. Switches $S_{1F}$ through $S_{10F}$ are all controlled by the state (i.e., count) of a second counter/decoder 118. A second latch 120 with double buffering of its stored state is provided to store a state of counter/decoder 118, and to provide the stored state as an output $SO_F$.

The set logic block controls the timing of the start of counter/decoders 114 and 118, and, in response to the output of comparator 110, controls the timing of the setting of latches 116 and 120.

The circuit 100 operates as follows. The bandgap voltage $V_{BG}$ at the inverting input of opamp 102 is used to generate a current that is independent of temperature and process using the precision external resistor $R_{EXT}$, which has the value 50 KΩ, which is 1,000 times the impedance value to be matched. This current is mirrored by the current mirror to the switched series bridge of resistors $R_1$, $R_2$, $R_3$ and $R_4$, with the switched series bridge of resistors serving as a coarse resistor string. Initially, switches $S_4$, $S_5$, and $S_6$ are all open. In an exemplary embodiment, in which the impedance to be matched is nominally 50 Ω, resistors $R_1$, $R_2$, and $R_3$ each have the value 10 KΩ, while resistor $R_4$ has the value 35 KΩ. These resistance values are 1,000 times larger than a corresponding set of resistances, discussed below, that will ultimately be used to actually set the termination impedance, in order to reduce the current drawn by the system. It will be appreciated that selection of the resistance values is a matter of design choice. Now, by controlling the settings of switches $S_1$, $S_2$, $S_3$, $S_{1A}$, $S_{2A}$, and $S_{3A}$, the switched series bridge of resistors is thus programmable from 35 KΩ to 65 KΩ in steps of 10 KΩ. For example, the value 65 KΩ is obtained by closing switches $S_{1A}$, $S_{2A}$, and $S_{3A}$, and opening switches $S_1$, $S_2$ and $S_3$, the value 45 KΩ is obtained by closing switches $S_{3A}$ and $S_2$, and opening switches $S_3$ and $S_{2A}$, and so forth. Switches $S_1$, $S_2$, $S_3$, $S_{1A}$, $S_{2A}$, and $S_{3A}$ are set in accordance with the current count of the counter part of counter/decoder 114, with the decoder part converting the count bits to switch control signals to provide an incrementally decreasing resistance in the switched series bridge of resistors, starting from 65 KΩ. Thus, at the beginning of an impedance tuning cycle, the set logic block 112 resets the counter part of counter/decoder 114 to zero and signals it to start counting. As it counts up from zero, the decoder part controls the switching of switches $S_1$, $S_2$, $S_3$, $S_{1A}$, $S_{2A}$, and $S_{3A}$ to cause the resistance value of the switched series bridge of resistors to decrement downward from 65 KΩ. As it does, the voltage at the non-inverting input of hysteresis comparator 110 decreases. When the value of that voltage drops below $V_{BG}$, the comparator output switches from a one to a zero, thus signaling to the set logic block 112 that a coarse resistance setting has been achieved. The set logic block 112 signals the counter part of counter/decoder 114 to decrement by one, to the count just prior to the count that resulted in the hysteresis comparator 110 switching, and it signals the latch 116 to store that decremented value. The value $S_{OC}$ is now available as an output, representing the coarse resistance setting. In addition, the resistance value of the switched series bridge of resistors is reset to the value corresponding to the decremented value of the counter part of counter/decoder 114.

Now, the set logic maintains the states of counter/decoder 114 and latch 116, and closes switch $S_4$, $S_5$, or $S_6$, depending on which of switches $S_1$, $S_2$, or $S_3$ is presently closed. It also opens the one of switches $S_1$, $S_2$, or $S_3$ that is presently closed. For example, if switch $S_2$ is closed in the coarse adjust set state, meaning that the switched series bridge of resistors is set to the value 45 KΩ, switch $S_2$ will now be opened (note that switch $S_{2A}$ is also open), and switch $S_5$ is closed, with switches $S_4$ and $S_6$ remaining open. In this way, the series resistor bridge of resistors $R_{1F}$, $R_{2F}$, $R_{3F}$ . . . and $R_{10F}$, are put in place to replace resistor $R_2$, the removal of which caused hysteresis comparator 110 to switch. As mentioned above, each of resistors $R_{1F}$, $R_{2F}$, $R_{3F}$ . . . and $R_{10}F$ has the value of 1 KΩ.

Set Logic Block 112 now resets the counter part of counter/decoder 118 to zero and signals it to start counting. As it counts up from zero, the decoder part controls the switching of switches $S_{1F}$, $S_{2F}$, . . . $S_{9F}$, to cause the resistance value of the series resistor bridge to decrement downward from 10 KΩ in 1 KΩ increments. As it does, the voltage at the non-inverting input of hysteresis comparator 110 decreases. When the value of that voltage drops below $V_{BG}$, the comparator output once again switches from a one to a zero, thus signaling to the set logic block 112 that a fine resistance setting has been achieved. The value $S_{OF}$ is now available as an output, representing the fine resistance setting. Together, the values $S_{OC}$ and $S_{OF}$ provide the calibrated resistance setting for the termination impedance. This calibrated resistance value is then used to program a corresponding resistor network (not shown), that is, however, as mentioned above, not scaled. Thus, the resistance values in the corresponding resistor network are 1,000 smaller than the resistances in the calibration system 100. The corresponding resistor network is used to set the actual termination impedance. Closeness of correspondence of the resistances of the two networks is a function of layout, as process variations in one network will be the same in the other network, and therefore cancel.

Figure 2A:
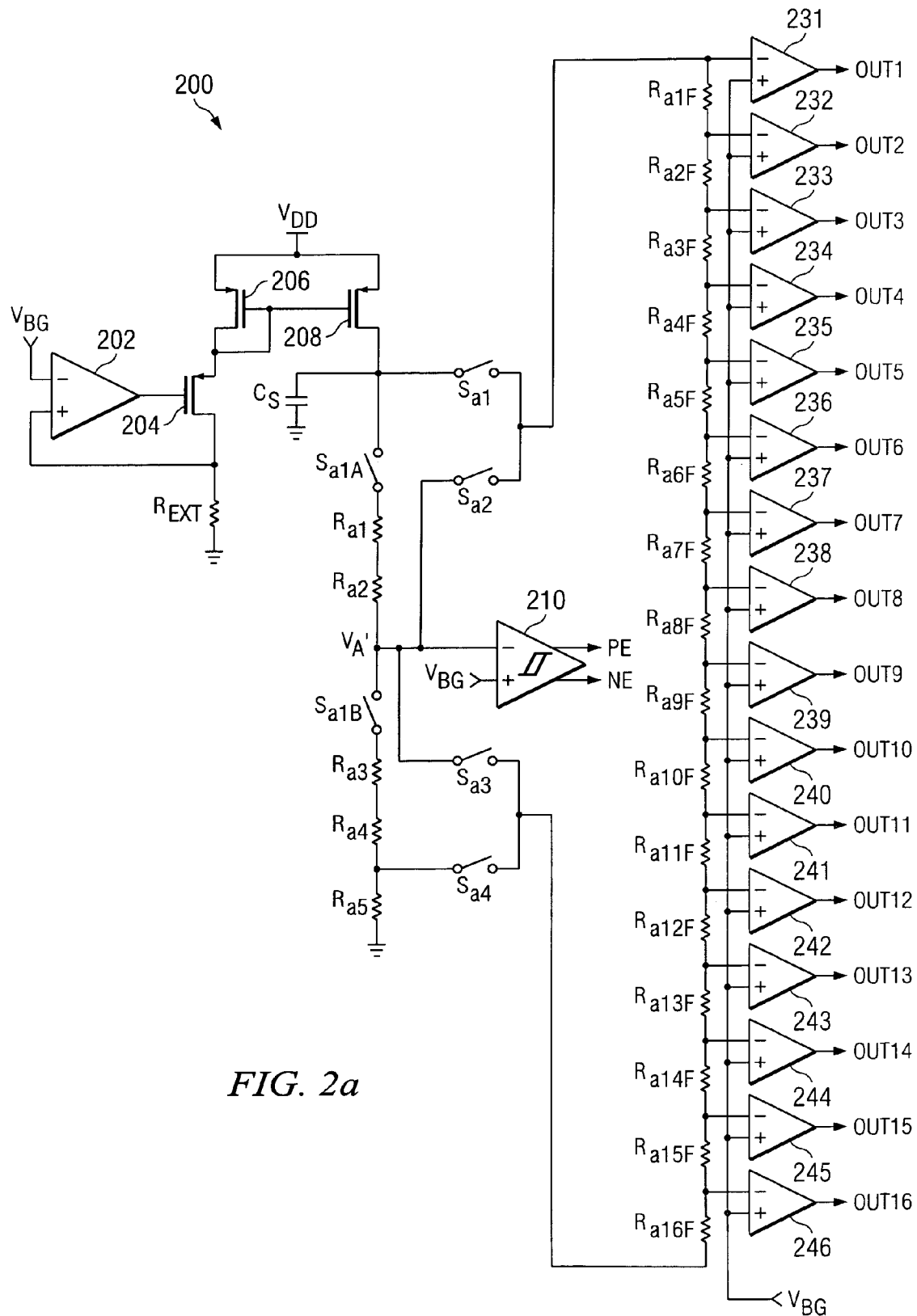
FIGS. 2a through 2d are a circuit diagram of a second preferred embodiment of the present invention.
Figure 2B:
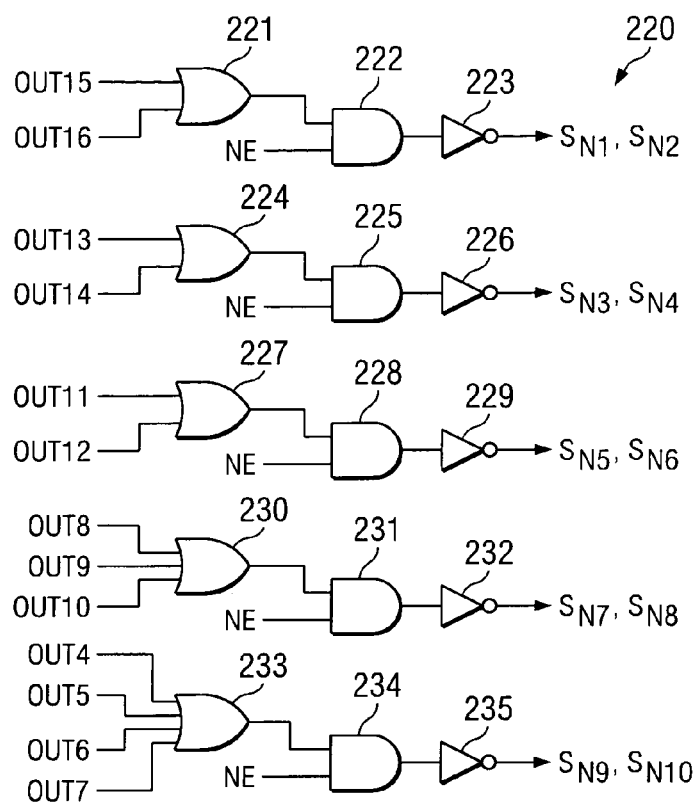

A second preferred embodiment 200 of a calibration system according to the present invention is shown in FIGS. 2a and 2b. System 200 represents an improvement over system 100, as it continuously calibrates the termination impedance. In system 200, circuit elements 202, 204, $R_{EXT}$, 206, 208 and $C_S$ are the same as circuit elements 102, 104, $R_{EXT}$, 106, 108 and $C_S$ of system 100, and operate in the same way as described above for them.

In system 200, the output side of the current mirror is connected to one port of a switch $S_{a1A}$, the other port of which is connected to one end of a series pair of resistors $R_{a1}$ and $R_{a2}$. The output side of the current mirror is also connected to a first port of a switch $S_{a1}$. The other end of the series pair of resistors $R_{a1}$ and $R_{a2}$ is connected to node $V_A'$, which is the inverting input of a comparator 210, with comparator 210 having one-sided hysteresis of 50 mV. A bandgap voltage $V_{BG}$ is connected to the non-inverting input of opamp 210. Comparator 210 has differential outputs NE and PE, with NE being the non-inverted logical output of comparator 210, and PE being the inverted logical output of comparator 210.

Node $V_A'$ is also connected to one port of a switch $S_{a1B}$, the other port of which is connected to one end of a series pair of resistors $R_{a3}$ and $R_{a4}$. Switches $S_{a1A}$ and $S_{a1B}$ are controlled by the outputs of a comparator 210, as described below. Node $V_A'$ is also connected to a first port of a switch $S_{a2}$, and to a first port of a switch $S_{a3}$. The other end of the series pair of resistors $R_{a3}$ and $R_{a4}$ is connected to one port of a resistor $R_{a5}$, the other port of which is connected to ground. The common connection node of resistors $R_{a4}$ and $R_{a5}$ is connected to a first port of a switch $S_{a4}$. In a preferred embodiment, each of resistors $R_{a1}$ through $R_{a4}$ has the value of 10 KΩ, and $R_{a5}$ has the value of 30 KΩ, the series string of resistors $R_{a1}$ through $R_{a5}$ serving as coarse adjust for the termination impedance.

The second ports of switches $S_{a1}$ and $S_{a2}$ are connected together and to one port of resistor $R_{a1F}$ at a first end of a fine adjust resistor string comprising end-to-end series connected resistors $R_{a1F}$ through $R_{a16F}$, the series string of resistors $R_{a1F}$ through $R_{a16F}$ serving as fine adjust for the termination impedance. Switches $S_{a1}$ and $S_{a2}$ are controlled by the outputs of a comparator 210, as described below. In a preferred embodiment, resistors $R_{a1F}$ through $R_{a16F}$ each have the value 1.25 KΩ. The second ports of switches $S_{a3}$ and $S_{a4}$ are connected together and to one port of resistor $R_{a16f}$ at the second end of the fine adjust resistor string. Switches $S_{a3}$ and $S_{a4}$ are controlled by the outputs of a comparator 210, as described below. A set of comparators 231 through 246 is provided, the non-inverting inputs of each being connected to a bandgap voltage $V_{BG}$. Comparators 231 through 246 have outputs OUT1 through OUT16, respectively. Outputs OUT7 through OUT16 are provided to a negative process shift logic block 220, shown in FIG. 2b, while outputs OUT1 through OUT11 are provided to a positive process shift logic block 240, shown in FIG. 2c. The outputs of logic block 220 and 240 control a network of switches in a terminating resistor network 260, shown in FIG. 2d, as explained in detail below.

Returning to FIG. 2a, the inverting input of comparator 231 is connected to the first end of the fine adjust resistor string. The common connection node of resistors $R_{a1F}$ and $R_{a2F}$ is connected to the inverting input of comparator 232, while the common connection node of resistors $R_{a2F}$ and $R_{a3F}$ is connected to the inverting input of comparator 233, the common connection node of resistors $R_{a3F}$ and $R_{a4F}$ is connected to the inverting input of comparator 234, and so forth, with the common connection node of resistors $R_{a15F}$ and $R_{a16F}$ being connected to the inverting input of comparator 246.

FIG. 2b shows the negative process shift logic block 220. In it, outputs OUT15 and OUT16 are provided as inputs to an OR gate 221, while the output of OR gate 221 is provided as a first input to an AND gate 222. The second input to AND gate 222 is the negative enable signal NE from comparator 210. The output of AND gate 222 is input to an inverter 223, the output of which controls switches $S_{N1}$ and $S_{N2}$ (FIG. 2d). Outputs OUT13 and OUT14 are provided as inputs to an OR gate 224, while the output of OR gate 224 is provided as a first input to an AND gate 225. The second input to AND gate 225 is the negative enable signal NE. The output of AND gate 225 is input to an inverter 226, the output of which controls switches $S_{N3}$ and $S_{N4}$ (FIG. 2d). Outputs OUT11 and OUT12 are provided as inputs to an OR gate 227, while the output of OR gate 227 is provided as a first input to an AND gate 228. The second input to AND gate 228 is the negative enable signal NE. The output of AND gate 228 is input to an inverter 229, the output of which controls switches $S_{N5}$ and $S_{N6}$ (FIG. 2d). Outputs OUT8, OUT9 and OUT10 are provided as inputs to an OR gate 230, while the output of OR gate 230 is provided as a first input to an AND gate 231. The second input to AND gate 231 is the negative enable signal NE. The output of AND gate 231 is input to an inverter 232, the output of which controls switches $S_{N7}$ and $S_{N8}$ (FIG. 2d). Outputs OUT4, OUT5, OUT6 and OUT7 are provided as inputs to an OR gate 233, while the output of OR gate 233 is provided as a first input to an AND gate 234. The second input to AND gate 234 is the negative enable signal NE. The output of AND gate 234 is input to an inverter 235, the output of which controls switches $S_{N9}$ and $S_{N10}$ (FIG. 2d).

Figure 2C:
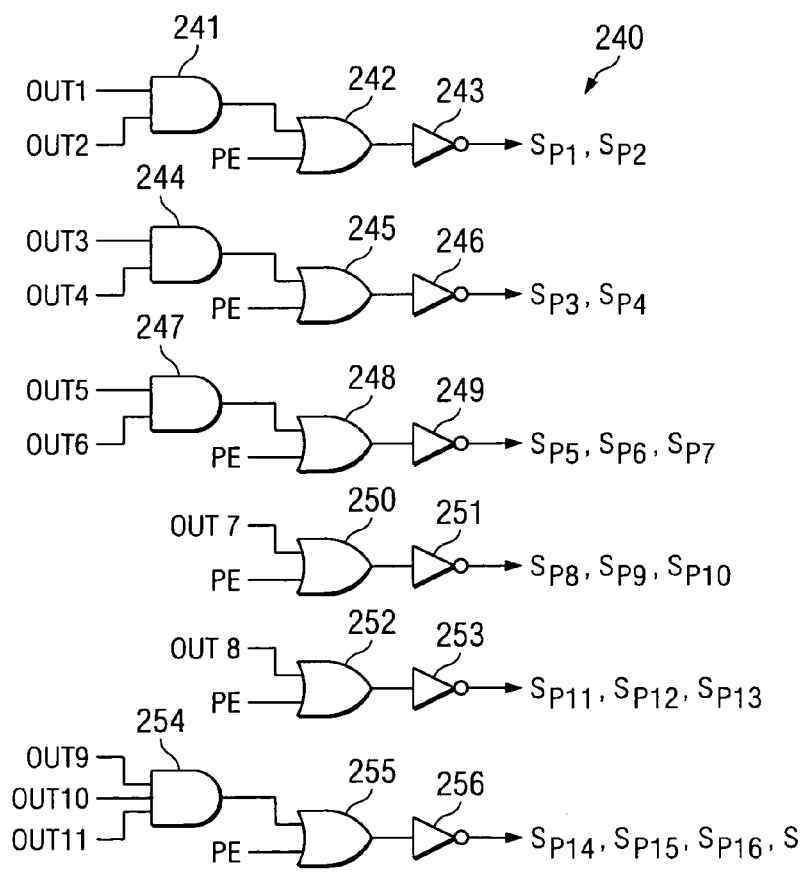
Figure 2D:
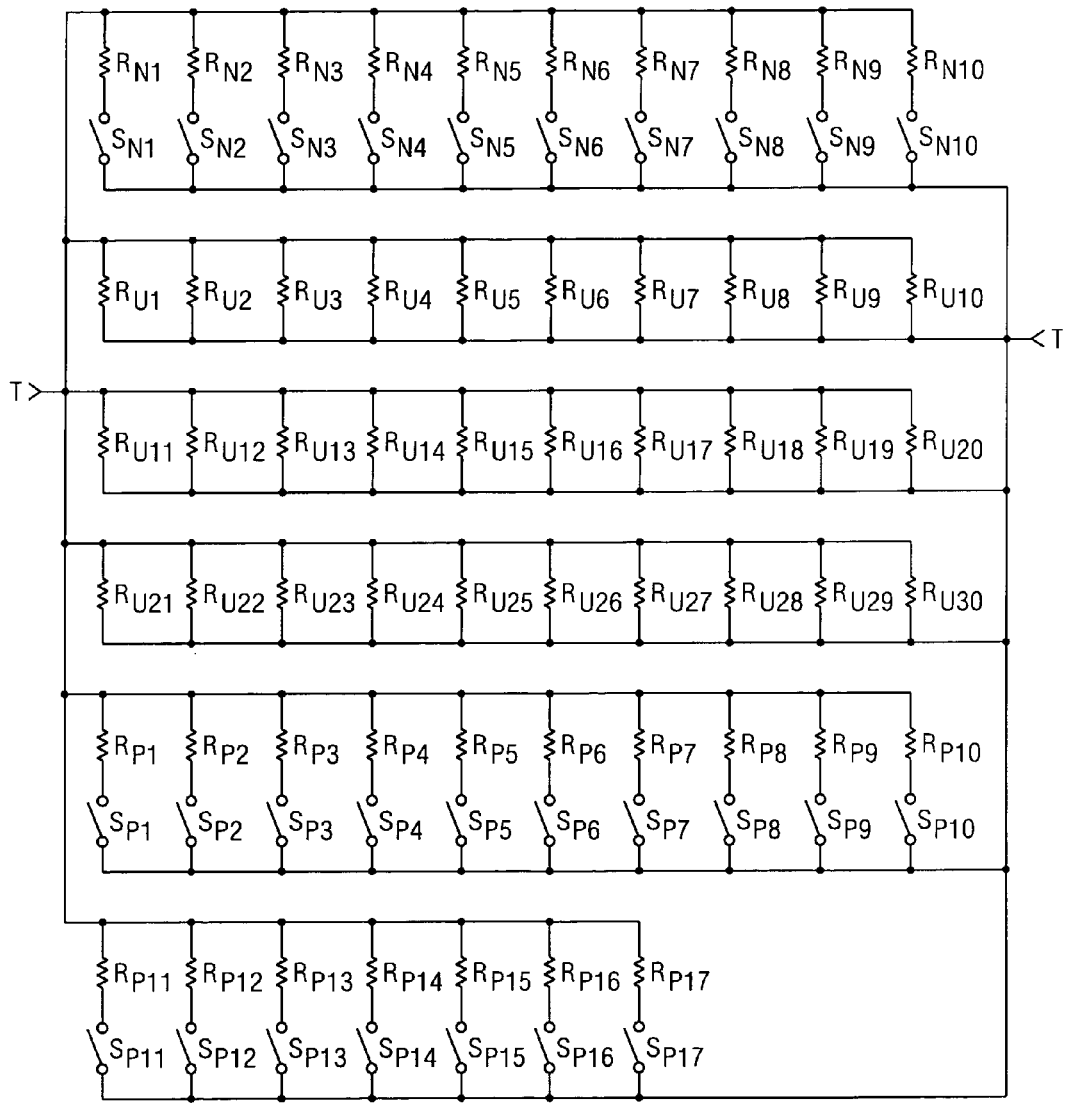

FIG. 2c shows the positive process shift logic block 240. In it, outputs OUT1 and OUT2 are provided as inputs to an AND gate 241, while the output of AND gate 241 is provided as a first input to an OR gate 242. The second input to OR gate 242 is the positive enable signal PE from comparator 210. The output of OR gate 242 is input to an inverter 243, the output of which controls switches $S_{P1}$ and $S_{P2}$ (FIG. 2d). Outputs OUT3 and OUT4 are provided as inputs to an AND gate 244, while the output of AND gate 244 is provided as a first input to an OR gate 245. The second input to OR gate 245 is the positive enable signal PE. The output of OR gate 245 is input to an inverter 246, the output of which controls switches $S_{P3}$ and $S_{P4}$ (FIG. 2d). Outputs OUT5 and OUT6 are provided as inputs to an AND gate 247, while the output of AND gate 247 is provided as a first input to an OR gate 248. The second input to OR gate 248 is the positive enable signal PE. The output of OR gate 248 is input to an inverter 249, the output of which controls switches $S_{P5}$, $S_{P6}$ and $S_{P7}$ (FIG. 2d). Output OUT7 is provided as a first input to an OR gate 250. The second input to OR gate 250 is the positive enable signal PE. The output of OR gate 250 is input to an inverter 251, the output of which controls switches $S_{P8}$, $S_{P9}$ and $S_{P10}$ (FIG. 2d). Output OUT8 is provided as a first input to an OR gate 252. The second input to OR gate 252 is the positive enable signal PE. The output of OR gate 252 is input to an inverter 253, the output of which controls switches $S_{P11}$, $S_{P12}$ and $S_{P13}$ (FIG. 2d). Outputs OUT9, OUT10 and OUT1 are provided as inputs to an AND gate 254, while the output of AND gate 254 is provided as a first input to an OR gate 255. The second input to OR gate 255 is the positive enable signal PE. The output of OR gate 255 is input to an inverter 256, the output of which controls switches $S_{P14}$, $S_{P15}$, $S_{P16}$ and $S_{P17}$ (FIG. 2d).

The resistor network 260 that comprises the actual termination resistance is shown in FIG. 2d. It comprises ten switched negative process shift adjustment resistors $R_{N1}$ through $R_{N10}$, each of which is serially connected with an associated switch $S_{N1}$ through $S_{N10}$, respectively, all of the serially connected resistors and switches being connected in parallel between the outputs T and T', as shown. Thirty unswitched resistors $R_{U1}$ through $R_{U30}$ are also connected in parallel between outputs T and T', as shown. Finally, seventeen switched positive process shift adjustment resistors $R_{P1}$ through $R_{P17}$ are also serially connected with an associated switch $S_{P1}$ through $S_{P17}$, respectively, with all of the serially connected resistors and switches being connected in parallel between the outputs T and T', as shown. In a preferred embodiment, each of the resistors in network 260 have the value 2 KΩ, although different numbers of resistors may be selected for different granularities of adjustment, and different resistor values may be selected for different increments of adjustment.

System 200 operates as follows. First, note that in system 200, the one-sided hysteresis of comparator 210 functions to sense process variations in the resistor string. If the process is nominal, then the voltage at the inverting input of comparator 110, $V_A'$, is equal to $V_{BG}$, ideally. However, due to current mismatch errors, and offset voltages in the comparator, $V_A$ is usually a few millivolts off. The comparator preferably has approximately 90 dB of gain, with +ve feedback, and consumes no more than 40 μA of current.

Thus, in the case of a process shift in the negative direction, $V_A'$, is less than $V_{BG}$, and so the output of comparator 210 is logic one, i.e., NE is one and PE is zero. Now, switches $S_{a1A}$ and $S_{a1B}$ are controlled by the outputs of a comparator 210, as mentioned above. When NE is one, switch $S_{a1A}$ is open, while switch $S_{a1B}$ is closed, and switches $S_{a1}$ and $S_{a3}$ are closed, while switches $S_{a2}$ and $S_{a4}$ are open.

Conversely, when PE is one, switch $S_{a1A}$ is closed, while switch $S_{a1B}$ is open, and switches $S_{a2}$ and $S_{a4}$ are closed, while switches $S_{a1}$ and $S_{a3}$ are open. Thus, in the case of a process shift in the negative direction, since NE is one, switch $S_{a1A}$ is open, while switch $S_{a1B}$ is closed, and switches $S_{a2}$ and $S_{a4}$ are closed, while switches $S_{a1}$ and $S_{a3}$ are open. Thus, the fine adjust resistor string of resistors $R_{a1F}$ through $R_{a16F}$ is substituted for resistors $R_{a1}$ and $R_{a2}$. Current is shunted through the fine adjust resistor string, thereby allowing the comparators 231 through 246 to monitor the voltage that is consequently built up across the string, and to determine the setting of switches to set the fine resistance to compensate, as described below.

In the case of a process shift in the positive direction, $V_A'$, is greater than $V_{BG}$, and so the output of comparator 210 is logic zero, i.e., NE is zero and PE is one. Therefore, switch $S_{a1A}$ is closed, while switch $S_{a1B}$ is open, and switches $S_{a1}$ and $S_{a3}$ are closed, while switches $S_{a2}$ and $S_{a4}$ are open. Thus, the fine adjust resistor string of resistors $R_{a1F}$ through $R_{a16F}$ is substituted for resistors $R_{a3}$ and $R_{a4}$. Current is once again shunted through the fine resistor string, thereby allowing the comparators 231 through 246 to monitor the voltage that is consequently built up across the string, and to determine the setting of switches to set the fine resistance to compensate, as described below.

As mentioned above, FIG. 2b shows the negative process shift logic block 220, while FIG. 2c shows the positive process shift logic block 240. In the case of a negative process shift, the switches $S_{N1}$ through $S_{N10}$ (FIG. 2d) are controlled by logic block 220 as shown in Table 1, again assuming that each of the resistors in network 260 has the value 2 KΩ. The bottom row indicates resistor subtractions as process deviation increases.

TABLE 1

|  | Outputs | | | | |
| --- | --- | --- | --- | --- | --- |
| Process Shift→ | −5% | −10% | −15% | −20% | −25% |
| OUT1 | 0 | 0 | 0 | 0 | 0 |
| OUT2 | 0 | 0 | 0 | 0 | 0 |
| OUT3 | 0 | 0 | 0 | 0 | 1 |
| OUT4 | 0 | 0 | 0 | 0 | 1 |
| OUT5 | 0 | 0 | 0 | 0 | 1 |
| OUT6 | 0 | 0 | 0 | 0 | 1 |
| OUT7 | 0 | 0 | 0 | 0 | 1 |
| OUT8 | 0 | 0 | 0 | 1 | 1 |
| OUT9 | 0 | 0 | 0 | 1 | 1 |
| OUT10 | 0 | 0 | 0 | 1 | 1 |
| OUT11 | 0 | 0 | 1 | 1 | 1 |
| OUT12 | 0 | 0 | 1 | 1 | 1 |
| OUT13 | 0 | 1 | 1 | 1 | 1 |
| OUT14 | 0 | 1 | 1 | 1 | 1 |
| OUT15 | 1 | 1 | 1 | 1 | 1 |
| OUT16 | 1 | 1 | 1 | 1 | 1 |
| Incremental Δ→ | −2 × 2 KΩ | −4 × 2 KΩ | −6 × 2 KΩ | −8 × 2 KΩ | −10 × 2 KΩ |

In the case of a positive process shift, the switches $S_{P1}$ through $S_{P17}$ (FIG. 2d) are controlled by logic block 240 as shown in Table 2. The bottom row indicates resistor additions as process deviation increases.

TABLE 2

|  | Outputs | | | | | | |
| --- | --- | --- | --- | --- | --- | --- | --- |
| Process Shift→ | 0% | +5% | +10% | +5% | +20% | +25% | +30% |
| OUT1 | 0 | 0 | 0 | 0 | 0 | 0 | 0 |
| OUT2 | 0 | 0 | 0 | 0 | 0 | 0 | 0 |
| OUT3 | 1 | 1 | 0 | 0 | 0 | 0 | 0 |
| OUT4 | 1 | 1 | 0 | 0 | 0 | 0 | 0 |
| OUT5 | 1 | 1 | 1 | 0 | 0 | 0 | 0 |
| OUT6 | 1 | 1 | 1 | 0 | 0 | 0 | 0 |
| OUT7 | 1 | 1 | 1 | 1 | 0 | 0 | 0 |
| OUT8 | 1 | 1 | 1 | 1 | 1 | 0 | 0 |
| OUT9 | 1 | 1 | 1 | 1 | 1 | 1 | 0 |
| OUT10 | 1 | 1 | 1 | 1 | 1 | 1 | 0 |
| OUT11 | 1 | 1 | 1 | 1 | 1 | 1 | 0 |
| OUT12 | 1 | 1 | 1 | 1 | 1 | 1 | 1 |
| OUT13 | 1 | 1 | 1 | 1 | 1 | 1 | 1 |
| OUT14 | 1 | 1 | 1 | 1 | 1 | 1 | 1 |
| OUT15 | 1 | I | 1 | 1 | 1 | 1 | 1 |
| OUT16 | 1 | 1 | 1 | 1 | 1 | 1 | 1 |
| Incremental Δ→ |  | +2× 2KΩ | +4× 2KΩ | +7× 2KΩ | +10 × 2KΩ | +13 × 2KΩ | +17 × 2KΩ |

In Table 2, note that for nominal process conditions, ideally the outputs OUT1 and OUT2 would each be "1", but the table shows them as having outputs "0", which may occur if there is a slight voltage offset in comparator 210, which is common. The operation of the system is not affected excessively by this condition.

Similar responses to changes in temperature and supply voltages are made. In this way, system 200 operates to continuously calibrate the termination impedance to maintain it at a value close to the target impedance, i.e., the impedance of the signal line. Note that the above-described adjustments are made in system 200 without the use of any clock signal, i.e., they are truly continuous over time.

Although the present invention and its advantages have been described in detail, it should be understood that various changes, substitutions and alterations can be made herein without departing from the spirit and scope of the invention as defined by the appended claims.

What is claimed is:

1. An impedance adjustment system, comprising:
    a current source adapted to provide a predetermined stabilized current corresponding to a current through a first resistor having across it a predetermined stabilized voltage;
    a first series connected string of a first predetermined number of resistors coupled between the current source and ground, being coupled to the current source at a sense node;
    a first switch network adapted to select ones of the first predetermined number of resistors for inclusion in the first series connected string;
    a first logic circuit adapted to control the first switch network to incrementally change the total resistance of the first series connected string;
    a comparator having a first input coupled to the predetermined stabilized voltage and having a second input coupled to the sense node, and having an output representing the direction of difference in voltage between the first input and the second input of the comparator;
    a second logic circuit responsive to the output of the comparator, adapted to hold a state of the first switch network to maintain a coarse resistance value of the first series connected string at a value corresponding to a value before which the comparator changes state when the first logic circuit incrementally changes the resistance of the first series connected string, while disconnecting the first series connected string from ground;
    a second series connected string of a second predetermined number of resistors having a first end coupled to ground, the second logic circuit being adapted to couple a second end of the second series connected string to the end of the portion of the first series connected string that provides the coarse resistance value;
    a second switch network adapted to select ones of the second predetermined number of resistors for inclusion in the second series connected string; and
    a third logic circuit adapted to control the second switch network to incrementally change the total resistance of the second series connected string, wherein the second logic circuit is responsive to the output of the comparator and adapted to hold a state of the second switch network to maintain a fine resistance value of the first series connected string at a value corresponding to a value at which the comparator changes state when the third logic circuit incrementally changes the resistance of the first series connected string.

2. An impedance adjustment system for providing a selected termination impedance between a pair of terminals, comprising:
    a current source adapted to provide a predetermined stabilized current corresponding to a current through a first resistor having across it a predetermined stabilized voltage;
    a first series connected string of a first predetermined number of resistors coupled between the current source and ground comprising a first, a second and a third serial segment thereof, having a first tap point at a connection node of the first and second serial segments and having a second tap point at a connection node of the second and third serial segments;
    a selection comparator having a first input connected to the predetermined stabilized voltage and having a second input connected to the first tap point, and having an inverting output, PE, and a non-inverting output, NE;
    a second series connected string of n resistors, each of the resistors in the second series connected string having associated therewith a respective output comparator having a first input connected to the predetermined stabilized voltage, and having a second input connected to one end of the respective resistor, the output comparators having n respective outputs;
    a first switch arrangement coupled to the selection comparator responsive to substitute the second series connected string of n resistors for the first serial segment when PE is high, and to substitute the second series connected string of n resistors for the second serial segment when NE is high;
    a network of resistors between the pair of terminals, having a plurality of switches to include or remove, in accordance with switch setting, one or more resistors from the network of resistors; and
    a logic block responsive to the n respective outputs of the output comparators to control the plurality of switches to include resistors in or remove resistors from the network of resistors adaptively so as to maintain a predetermined termination impedance between the terminals.

* * * * *